(12) United States Patent
Jain et al.

(10) Patent No.: US 8,854,871 B1
(45) Date of Patent: Oct. 7, 2014

(54) DYNAMIC CONTROL OF SPIN STATES IN INTERACTING MAGNETIC ELEMENTS

(71) Applicants: Shikha Jain, San Jose, CA (US); Valentyn Novosad, Lemont, IL (US)

(72) Inventors: Shikha Jain, San Jose, CA (US); Valentyn Novosad, Lemont, IL (US)

(73) Assignee: U.S. Department of Energy, Washington, DC (US)

( * ) Notice: Subject to any disclaimer, the term of this patent is extended or adjusted under 35 U.S.C. 154(b) by 0 days.

(21) Appl. No.: 14/082,260

(22) Filed: Nov. 18, 2013

Related U.S. Application Data

(60) Provisional application No. 61/727,834, filed on Nov. 19, 2012.

(51) Int. Cl.
*G11C 11/00* (2006.01)
*G11C 11/15* (2006.01)
*H01F 10/32* (2006.01)
*G11C 11/16* (2006.01)
*G11C 11/56* (2006.01)

(52) U.S. Cl.
CPC ............... *G11C 11/15* (2013.01); *H01F 10/32* (2013.01); *G11C 11/16* (2013.01); *G11C 11/1675* (2013.01); *G11C 11/1677* (2013.01); *G11C 11/5607* (2013.01)
USPC ............... 365/158; 365/48; 365/171; 365/97; 365/55; 365/66; 365/74

(58) Field of Classification Search
CPC ............... G11C 11/16; G11C 11/1675; G11C 11/1677; G11C 11/5607
USPC ................... 365/158, 48, 171, 97, 55, 66, 74
See application file for complete search history.

(56) References Cited

U.S. PATENT DOCUMENTS

| | | | | |
|---|---|---|---|---|
| 6,104,633 | A * | 8/2000 | Abraham et al. | 365/171 |
| 6,654,278 | B1 * | 11/2003 | Engel et al. | 365/158 |
| 6,906,369 | B2 * | 6/2005 | Ross et al. | 257/295 |
| 6,940,750 | B2 * | 9/2005 | Yamamoto et al. | 365/173 |
| 7,002,839 | B2 * | 2/2006 | Kawabata et al. | 365/171 |
| 7,099,185 | B2 * | 8/2006 | Yamamoto et al. | 365/158 |
| 7,593,250 | B2 * | 9/2009 | Naumov et al. | 365/145 |
| 7,697,243 | B1 * | 4/2010 | Novosad et al. | 360/324 |
| 7,764,454 | B2 * | 7/2010 | Roshchin et al. | 360/59 |
| 7,868,404 | B2 * | 1/2011 | Deak | 257/421 |
| 7,880,208 | B2 * | 2/2011 | Ingvarsson et al. | 257/295 |
| 7,952,915 | B2 * | 5/2011 | Ono et al. | 365/158 |
| 7,986,544 | B2 * | 7/2011 | Kent et al. | 365/148 |
| 8,164,148 | B2 * | 4/2012 | Kim et al. | 257/421 |
| 8,391,056 | B2 * | 3/2013 | Klein et al. | 365/158 |

(Continued)

*Primary Examiner* — Viet Q Nguyen
(74) *Attorney, Agent, or Firm* — Michael J. Dobbs; Daniel D. Park; John T. Lucas

(57) ABSTRACT

A method for the control of the magnetic states of interacting magnetic elements comprising providing a magnetic structure with a plurality of interacting magnetic elements. The magnetic structure comprises a plurality of magnetic states based on the state of each interacting magnetic element. The desired magnetic state of the magnetic structure is determined. The active resonance frequency and amplitude curve of the desired magnetic state is determined. Each magnetic element of the magnetic structure is then subjected to an alternating magnetic field or electrical current having a frequency and amplitude below the active resonance frequency and amplitude curve of said desired magnetic state and above the active resonance frequency and amplitude curve of the current state of the magnetic structure until the magnetic state of the magnetic structure is at the desired magnetic state.

20 Claims, 6 Drawing Sheets

(56) References Cited

U.S. PATENT DOCUMENTS

| | | | |
|---|---|---|---|
| 8,437,391 B2 * | 5/2013 | Sergeev et al. | 375/240.1 |
| 8,625,335 B2 * | 1/2014 | Morise et al. | 365/157 |
| 8,654,576 B2 * | 2/2014 | Kawakami et al. | 365/158 |
| 8,679,653 B2 * | 3/2014 | Kawakami et al. | 428/811 |
| 2013/0121068 A1 * | 5/2013 | Ruotolo | 365/158 |
| 2014/0169371 A1 * | 6/2014 | DeCusatis et al. | 370/392 |

* cited by examiner

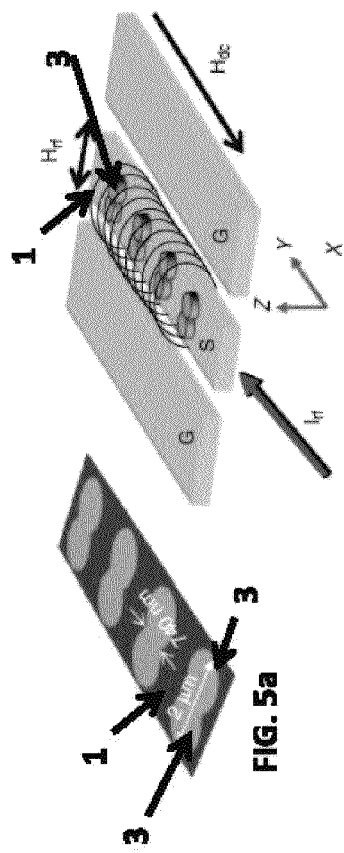
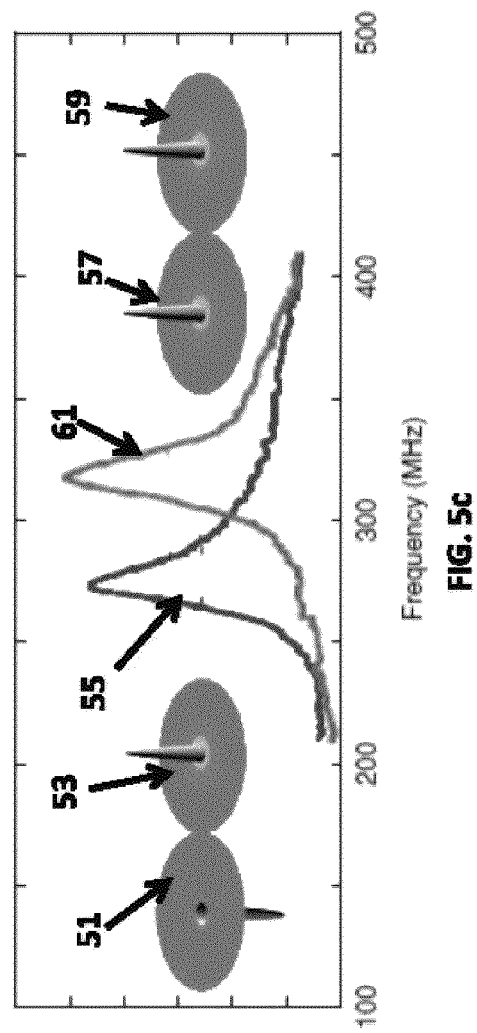

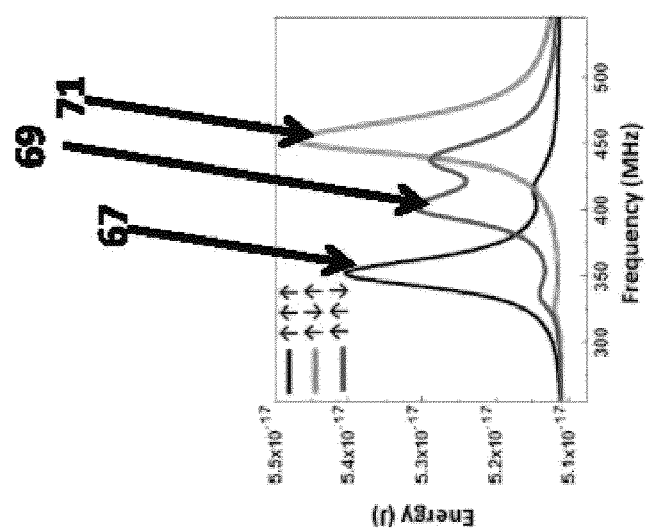
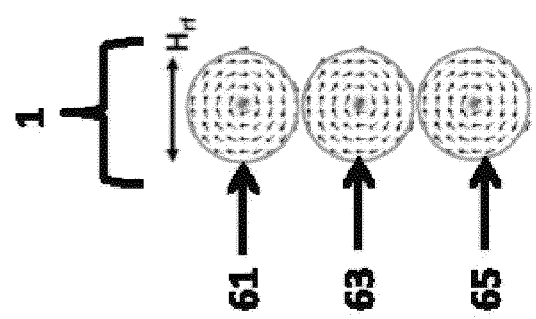
FIG. 6b
FIG. 6a

DYNAMIC CONTROL OF SPIN STATES IN INTERACTING MAGNETIC ELEMENTS

RELATED APPLICATIONS

This application is a claims priority to U.S. provisional patent application 61/727,834 filed Nov. 19, 2012, and is hereby fully incorporated in its entirety by reference.

GOVERNMENT INTERESTS

The United States Government has rights in this invention pursuant to Contract No. DE-AC02-06CH11357, between the U.S. Department of Energy (DOE) and Argonne LLC.

FIELD OF THE INVENTION

Embodiments of the present invention relate to the control of spin states of interacting magnetic elements. Preferably, various embodiments of the present invention are used control the spin states in magnonic crystals, nano-oscillators, filters, magnetic random access memory and logic devices, preferably vortex based.

BACKGROUND OF THE INVENTION

Although systems with a single magnetic element, not interacting with other magnetic elements, are easily manipulated, systems with multiple magnetic elements are currently uncontrollable due to their complex interactions. Attempts to control the 'up' or 'down' state of each magnetic element has only been successful for the magnetic element that is not interacting with another magnetic element. It is preferable to increase the density of magnetic devices to the point where a plurality of magnetic elements are in close enough proximity that they interact with each other. Once a plurality of magnetic elements begins to interact, the interaction not only complicates the system, but also makes changing the state of a single magnetic element seemingly impossible. The development of effective methods for the dynamic control of a plurality of magnetic element is key to the advancement of higher-density magnetic devices, which is highly desirable in for numerous magnetic devices, for example, magnonic crystals, nano-oscillators, magnetic random access memory and logic devices, preferably vortex based.

Vortices are observed in the statics and dynamics of a variety of physical systems, such as fluids and plasma, optics, superconductors and magnetic structures. In patterned mesoscopic ferromagnets, the ground state of the static magnetization can have a form of a vortex that consists of a large region of in-plane curling magnetization (clockwise or anti-clockwise sense of rotation or chirality) and a small core region (~10 nm) with out-of-plane magnetization, which can be pointing either up (+1) or down (−1) (positive or negative core polarity).

Magnetic data storage and logic devices, in general have the potential to provide higher speed, durability, low-power consumption and radiation resistant advantages over conventional products (semiconductor). Some of the conceptual designs incorporate magnetic vortices as the key element in its functionality. In this regard, lot of attention has been given to the fundamental research on vortex dynamics in confined magnetic geometries. So far, only conceptual research structures have been proposed for exploiting the fast-switching properties and storage bits capability of vortex cores. Their examples are magnetic random access memories, spin-torque nano-oscillators, magnetic storage and logic devices, and vortex-based magnonic crystals. For instance, magnonic crystals are the magnetic counterparts of photonic crystals and are theoretically proven to propagate signal information at a speed of few km/sec.

SUMMARY OF THE INVENTION

A method for the control of the magnetic states of interacting magnetic elements comprising providing a magnetic structure with a plurality of interacting magnetic elements. The magnetic structure comprises a plurality of magnetic states based on the state of each interacting magnetic element within the magnetic structure. The desired magnetic state of the magnetic structure is determined. The active resonance frequency and amplitude curve of the desired magnetic state is determined. Each magnetic element of the magnetic structure is then subjected to an alternating, in-plane magnetic field or an alternating electrical current having a frequency and amplitude below the active resonance frequency and amplitude curve of the desired magnetic state and above the active resonance frequency and amplitude curve of the current state of the magnetic structure until the magnetic state of the magnetic structure is at the desired magnetic state.

Preferably, the various embodiments described herein are used to control the magnetic states of a plurality of interacting magnetic elements. For example, but not limited to, data storage, microwave generation using an array of magnetically aligned magnetic elements, or the creation of magnonic crystals. In a preferred embodiment, the magnetic structure is a magnonic crystal, which has tunable magnetic properties using the various embodiments described herein.

BRIEF DESCRIPTION OF THE DRAWINGS

FIG. 5a depicts one embodiment of a plurality of magnetic field elements on a magnetic structure.

FIG. 5b depicts one embodiment of a magnetic structure with multiple magnetic elements as described above in FIG. 5a.

FIG. 5c depicts the active resonance frequency and amplitude curve of one embodiment as described in FIG. 5a and FIG. 5b.

FIG. 6a depicts a cross-sectional view from the top of one embodiment of a magnetic structure having three magnetic elements.

FIG. 6b depicts the active resonance frequency and amplitude curve of one embodiment as described in FIG. 6a.

DETAILED DESCRIPTION OF THE INVENTION

Figure 1:
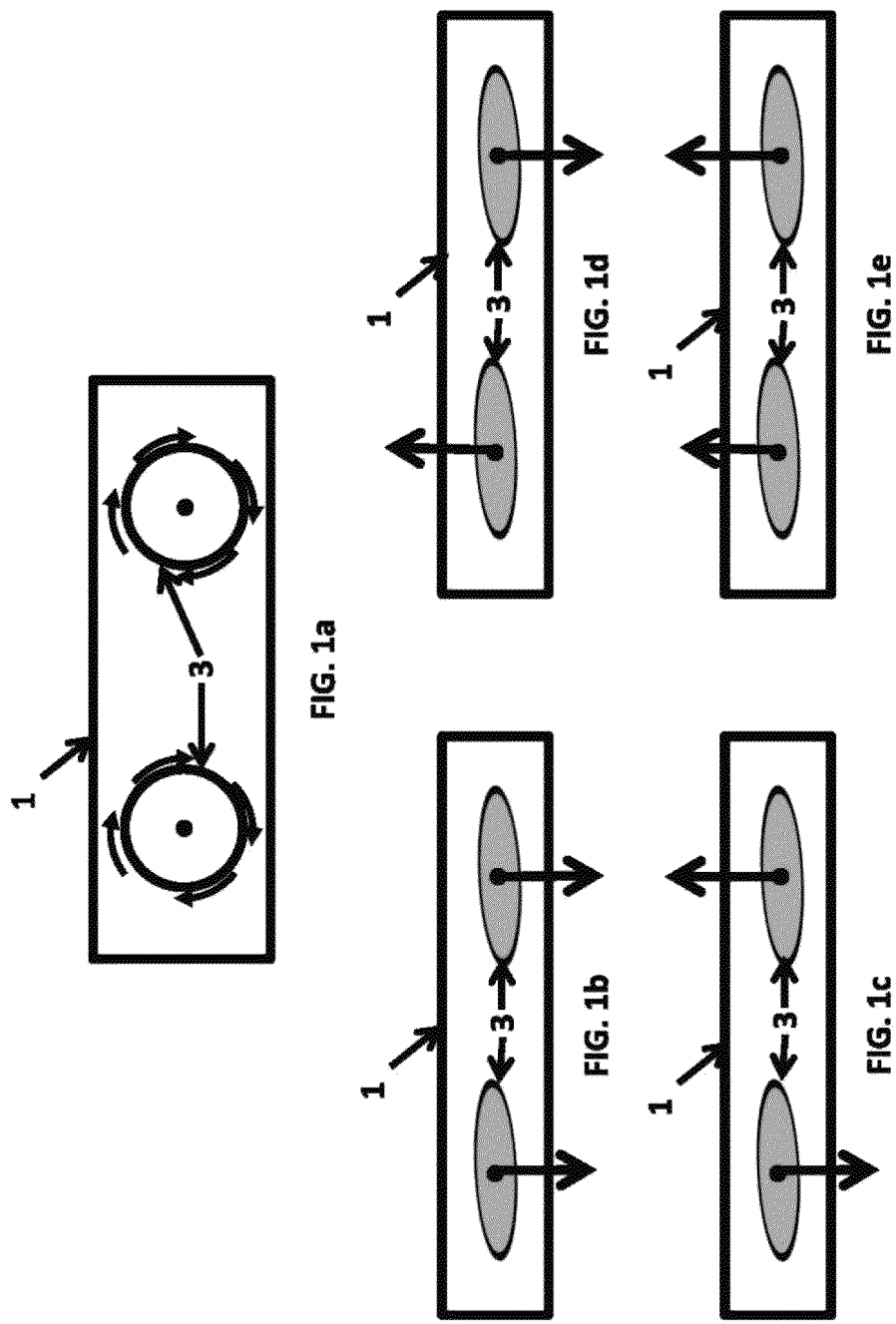
FIG. 1a depicts a cross-sectional view from the top of one embodiment of a magnetic structure.
FIG. 1b depicts a cross-sectional view from the side of one embodiment of a magnetic structure having magnetic elements a down-down state.
FIG. 1c depicts a cross-sectional view from the side of one embodiment of a magnetic structure having magnetic elements in a down-up state.
FIG. 1d depicts a cross-sectional view from the side of one embodiment of a magnetic structure having magnetic elements in an up-down state.
FIG. 1e depicts a cross-sectional view from the side of one embodiment of a magnetic structure having magnetic elements in an up-up state.

FIG. 1a-e depict one embodiment of a magnetic structure 1 with a plurality of interacting magnetic elements 3. FIG. 1a depicts a cross-sectional view from the top of one embodiment of a magnetic structure 1. The magnetic structure 1 comprises a plurality of magnetic states based on the state of each interacting magnetic element 3. For example, FIG. 1b depicts a cross-sectional view from the side of one embodiment of a magnetic structure 1 having magnetic elements 3 a down-down state. FIG. 1c depicts a cross-sectional view from the side of one embodiment of a magnetic structure 1 having magnetic elements 3 in a down-up state. FIG. 1d depicts a cross-sectional view from the side of one embodiment of a magnetic structure 1 having magnetic elements 3 in an up-down state. FIG. 1e depicts a cross-sectional view from the side of one embodiment of a magnetic structure 1 having magnetic elements 3 in an up-up state.

Magnetic Structure 1

The magnetic structure 1 is any structure made of any number materials and with any dimensions comprising a plurality of interacting magnetic elements 3. The magnetic structure 1 may form a two-dimensional (2D) or three-dimensional (3D) like shape. A two-dimensional (2D) will obviously have a thickness, but as known in the art, the thickness of a 2D shape will be insubstantial compared to the length and width of the shape. Preferably, a 2D shape has a length and width both of which are at least 10, more preferably 100, even more preferably at least 1,000, times larger than the thickness of the shape. In one preferred embodiment, the magnetic structure 1 forms a magnonic crystal and has a 3D shape. In one embodiment, one or more magnetic elements 3 are deposited on a silicon wafer, or other type of substrate. Preferably, the magnetic structure 1 is the plurality of interacting magnetic elements physically connected by a non-magnetic material. Preferably, the magnetic structure 1 is a magnonic crystal comprising a plurality of interacting magnetic elements 3.

In one embodiment, the magnetic structure 1 comprising an array of pairs of interacting magnetic elements 3, whereby each magnetic element 3 only interacts with one other magnetic element 3. In this embodiment, the control of each interacting magnetic element 3 is simplified by having only two interacting elements 3 per array cell, while allowing for increased density of magnetic elements 3 in the magnetic structure 1.

In yet another embodiment, the magnetic structure 1 is configured whereby a magnetic element 3 may interact with any number of other magnetic elements 3. For example, in one embodiment the magnetic structure 1 having an ovular shape is used to contain three magnetic elements 3, which has a unique state whereby the magnetic element 3 in between the other magnetic elements 3 may be put in an anti-vortex state. This embodiment has potential unknown and therefore its construction is highly desirable for further research.

In another embodiment, the magnetic structure 1 comprises any number of magnetic elements 3 all of which are interacting with each other.

Interacting Magnetic Element 3

Each interacting magnetic element 3 is a magnetic element that has a magnetic state influenced by at least one other magnetic element 3 within the magnetic structure 1. Preferably, each magnetic element 3 is optimized for close proximity to not only increase the number of magnetic elements in a position in given area, but also, maximize the magnetic interaction thereby increasing the different in resonance frequencies for the various states of the resulting plurality of magnetic elements. Preferably, each magnetic element is within 1 nm to 100 nm of another magnetic element, depending on various factors of the magnetic element, for example, size, shape, magnetic material, state, other magnetic fields, etc.

Preferably, each magnetic element 3 is in a magnetic vortex, single domain, multiple domain, collinear spin arrangement, or a combination thereof magnetic state. In preferred embodiments, each magnetic element 3 is in a single magnetic vortex magnetic state.

Each magnetic element 3 is made of any ferromagnetic material, preferably Ni, Fe, Co, MnBi, MnSb, $FeOFe_2O_3$, $NiOFe_2O_3$, $CuOFe_2O_5$, $MgOFe_2O_3$, $MnOFe_2O_3$, $Y_3Fe_5O_{12}$, $CrO_2$, $Co_{40}Fe_{40}B_{20}$, combinations thereof, and alloys thereof. In the preferred embodiment, one or more magnetic elements 3 are made of Ni and Fe, more preferably $Ni_{80}Fe_{20}$.

In a preferred embodiment, the one or more interacting magnetic elements 3 comprises one or more magnetic vortices as described in U.S. Pat. No. 7,697,243, hereby fully incorporated by reference. As described in U.S. Pat. No. 7,697,243 each magnetic element 3 has a size, shape, and material selected such that the electron spin within the sensor align to create a single vortex at remanence (zero magnetic field). Shapes having a width to diameter ratio of 0.5 to 2 are preferable. Some examples of triangles, circles, and ovals. The shape of a circle (dot) most favors a stable magnetic vortex, and therefore, is the preferred shape.

Figure 3:
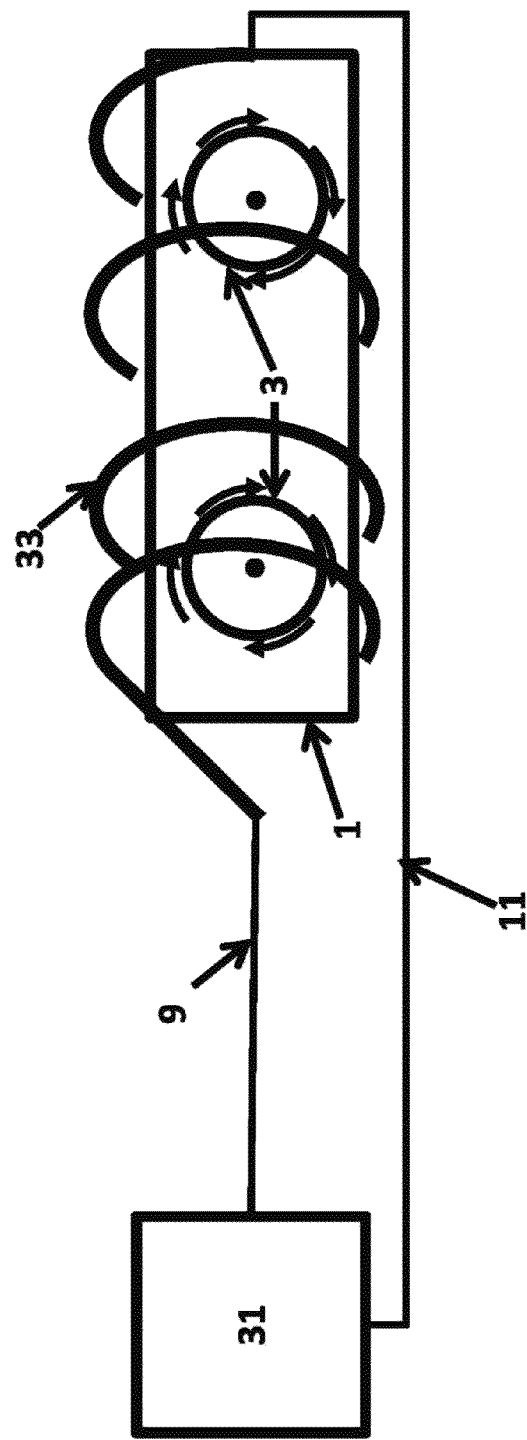
FIG. 3 is a cross-sectional view of one embodiment of a magnetic structure subjected to an alternating magnetic field generated by an electrical conductor positioned around the magnetic structure.

The calculation of a radius and thickness required for a given ferromagnetic material to support a single magnetic vortex is described in K. S. Buchanan, K. Yu, Guslienko, A, Scholl, S. D. Bader, and V. Novosad, *Magnetic remanent states and magnetization reversal in patterned trilayer nanodots*, Physical Review B, Vol 72, no. 134415 (2005) herein fully incorporated by reference. As the article states, a spacer of $1000 l_{ex}$, where $l_{ex}$ is the micromagnetic exchange length of the material of the ferromagnetic member, can be considered as a single ferromagnetic member. $l_{ex}$ is defined as $sqrt(2A)/M_s$, where A is the exchange stiffness constant of the material of the ferromagnetic member, and $M_s$ is the saturation magnetization of the material of the ferromagnetic member. FIG. 3 of U.S. Pat. No. 7,697,243 shows a magnetic phase diagram 301 for single 305 and multi-member ferromagnetic members. The y-axis is the result of the radius (R) divided by $l_{ex}$ of the material of the ferromagnetic member. The x-axis is the thickness (L) of the ferromagnetic member divided by $l_{ex}$. Under a curve is a single magnetic domain state (either horizontally, or vertically). If the ferromagnetic member has a radius and thickness above a curve the desired single magnetic vortex will form at remanence.

For a circular $Ni_{80}Fe_{20}$ magnetically-soft, magnetic element 3, a thickness between 8-150 nm thickness with a diameter between 100 nm to 2,500 nm is known to work, but not all combinations will work, as shown in FIG. 3 of U.S. Pat. No. 7,697,243. Circular $Ni_{80}Fe_{20}$ magnetically-soft, magnetic element having a diameter of about 1000 nm with a thickness of 20-60 nm are preferable.

Determining the Desired Magnetic State

The desired magnetic state of the magnetic structure is determined, preferably by the user or the manufacturer. In one embodiment, the magnetic elements 3 are used for data storage, and therefore the desired magnetic state will be the value related to the data to be stored into the magnetic elements 3. In this embodiment, the desired magnetic state is preferably designed to change during operation of the device.

In an alternate embodiment, the desired magnetic state is a static magnetic state, for example when used for microwave generation using an array of magnetically aligned magnetic elements 3. Another embodiment the magnetic elements are used as a magnonic crystal, which has tunable magnetic properties using the various embodiments described herein. In one embodiment, the magnetic elements 3 are set during manufacture. In yet another embodiment, the magnetic elements 3 are set after manufacture, for example, but not limited to, periodically, at the direction of the user, or when a deviation from the desired magnetic state is detected.

Determining the Active Resonance Frequency and Amplitude Curve of the Desired Magnetic State The active resonance frequency and amplitude curve of the desired magnetic state is determined, preferably, by a spectrograph or other investigative technique. Preferably, once the magnetic elements 3 of the magnetic structure 1 are in the desired state, the active resonance frequency and amplitude curve of the desired state are determined, preferably by a spectrograph. In a preferred embodiment, each magnetic element 3 of the magnetic structure 1 is subjected to an in-plane magnetic field or an electrical current passing through each magnetic element 3 and the absorption of the energy is recorded. The resulting data is then used to construct the active resonance frequency and amplitude curve, whereby a frequency and amplitude below the active resonance frequency and amplitude curve is insignificant to change the state of the magnetic material 1 away from the desired magnetic state. It is important to determine the active resonance frequency and amplitude curve to avoid having the desired state inadvertently overpassed when the system is trying to bring the magnetic structure 1 to the desired state.

The active resonance frequency and amplitude curve is preferably determined by broadband ferromagnetic resonance spectroscopy (FMR). In one embodiment, an electrical current through an electrical conductor, preferably a coil positioned around one or more magnetic elements 3, produces alternating magnetic fields in electromagnetic communication with each magnetic element 3, for example, but not limited to, as shown in FIG. 3. Measurements are then taken for the resulting absorption of the electromagnetic field in the one or more magnetic elements of various frequencies. A high absorption frequency indicates the resonance frequency for the current state of the magnetic elements 3 of the magnetic structure 1. In a preferred embodiment, the alternating magnetic field is used to determine active resonance frequency and amplitude curve and then apply an amplitude and frequency above the determined active resonance frequency and amplitude curve until the magnetic elements 3 reach active resonance as described herein.

In one embodiment, the magnetic structure 1 is analyzed by continually bringing the magnetic elements 3 of the magnetic structure 1 to the active resonance frequency of the state of the magnetic structure 1. For example a large amplitude at a frequency central to the various states of the magnetic structure 1 may be used to continuously bring the magnetic structure 1 into active resonance and thereby cycle through the various states. The active resonance frequency and amplitude curve of each state is recorded for at least the desired magnetic state.

Active Resonance Frequency and Amplitude Curve

The active resonance frequency and amplitude curve identifies the transition into active resonance of one or more magnetic elements 3. The active resonance of the material depends on various factors such as magnetic element 3 material, size, shape, distance between magnet elements, the spacing or material between the magnetic elements 3, magnetic fields external to the magnetic structure, and combinations thereof. During active resonance of the magnetic elements 3, the magnetic elements 3 will be in a chaotic state of continuous reversals, for example vortex core reversals, whereby the interaction between the plurality of magnetic elements 3 causes a continuous change in polarity of one or more magnetic elements 3.

Preferably, the active resonance frequency, which is the frequency most absorbed by the magnetic elements 3 of the magnetic structure 1 is determined. As the absorption by the magnetic elements 3 of the magnetic structure us highest at the active resonance frequency, the use of the frequency to change the state of the magnetic elements 3 of the magnetic structure 1 will require the least amount of energy. Therefore, the use of a frequency approximately, more preferably at, the active resonance frequency to change the state of the magnetic elements 3 of the magnetic structure 1 is preferred. As one skilled in the art will recognize, the active resonance frequency does not have to be exactly used or not used at all, but additional power will be needed to have a frequency and amplitude above the transition line of the active resonance frequency and amplitude curve.

Natural Magnetic State

When the magnetic elements 3 are not in active resonance (below the active resonance frequency and amplitude curve), they are in a natural magnetic state is a state at which the magnetic elements 3 are in without external influence. Preferably, the magnetic elements 3 are returned to their natural state by removing the exposure of the alternating magnetic field or electrical current that drove the magnetic elements 3 into active resonance.

When the vortex core is perturbed from its equilibrium state by an in-plane oscillating field or current, it begins a rotational (gyrotropic) oscillation with a characteristic eigenfrequency in the sub-gigahertz range [5-7]. In a magnetic dot that has a single vortex-state, the eigenfrequency of the gyrotropic oscillations of the vortex core for both directions of the core polarity (p=±1) is the same. By contrast, in an array of coupled elements, the dynamic dipolar interaction eliminates this frequency degeneracy and results in collective gyrotropic excitations with different eigenfrequencies that depend on both the relative polarities and chiralities of the individual vortices [8-11]. An array of interacting magnetic dots form a vortex magnonic crystal [12, 13], similar to the case of coupled, uniformly magnetized elements [14, 15]. The system can have a dynamically reconfigurable ground state characterized by different relative polarities and chiralities of the individual dots; and it can have a corresponding dynamically controlled spectrum of collective excitation modes that determine the microwave absorption of the crystal.

Subjecting Each Magnetic Element of the Magnetic Structure to an Alternating Magnetic Field or Electrical Current Each magnetic element of the magnetic structure is then subjected to an alternating magnetic field or electrical current having a frequency and amplitude below the active resonance frequency and amplitude curve of the desired magnetic state and above the active resonance frequency and amplitude curve of the current state of the magnetic structure until the magnetic state of the magnetic structure is at the desired magnetic state.

The alternating magnetic field or electrical current is preferably a magnetic field or electrical current having a constant frequency with an alternating amplitude, a constant amplitude with an alternating frequency, or both alternating frequency and amplitude. An alternating frequency or amplitude refers to any increasing, decreasing, or combinations thereof waveforms in any form (e.g. sinusoidal, square, triangle, linear, exponential, etc.), preferably at least approximately a sinusoidal waveform. In yet another embodiment, the magnetic field is generated from a source producing a constant frequency and amplitude and the magnetic field is periodically moved or blocked from electromagnetic communication with one or more of the magnetic elements.

In a preferred embodiment, the alternating magnetic field or electrical current is a one or more pulses, preferably a single pulse, designed to quickly bring the magnetic elements 3 of the magnetic structure 1 into active resonance only long enough to change states at least one. Therefore, the one or more pulses are at a frequency and amplitude exceeding the of the active resonance frequency and amplitude curve.

In one embodiment, the alternating frequency is generated by changing, preferably sweeping from low to high, high to low or a combination thereof, the frequency of alternating magnetic field or electrical current, while maintaining the amplitude of alternating magnetic field at a constant. In this embodiment, the fixed amplitude is optimized to create active resonance, preferably while minimizing the size and energy consumption of components in the system, for example power supply, or power magnets.

In yet another embodiment, the alternating frequency is generated by changing, preferably sweeping from low to high, high to low or a combination thereof, the amplitude of the alternating magnetic field or electrical current and maintain the frequency at a constant. In this embodiment, the fixed amplitude is optimized to create active resonance, preferably while minimizing the size and energy consumption of components in the system, for example power supply, power magnets, etc.

In the alternative, a magnetic field or electrical current having a fixed frequency and amplitude may be selectively enabled or disabled. For example, one or more transistors may control current across one or more magnetic elements or one or more electromagnets for a short time period and intermittently turn on and off, thereby generating an alternating frequency.

In yet another embodiment, the alternating frequency is generated by changing the resonance of the plurality of magnetic elements, for example by altering the temperature, size of one or more of the magnetic elements. In yet another embodiment, the resonance of the plurality of magnetic elements is modified by the addition of an external magnetic field, preferably from a power magnet in electromagnetic communication with one or more magnetic elements.

In one embodiment, the electrical resistance or other detectable characteristic of the plurality of magnetic elements are used to determine the current magnetic state of the magnetic structure. In a preferred embodiment, the electrical resistance of a magnetic structure is measured for each state and recorded in a resistance table with the active resonance and amplitude curve of the corresponding magnetic state. Afterwards, the state of the magnetic structure is determined by simply determining the resistance of the magnetic structure, preferably using an analog-to-digital converter and by using Ohms Law (or other resistance measuring technique) and looking up the previously recorded resistance on the resistance table.

FIG. 2

Figure 2:
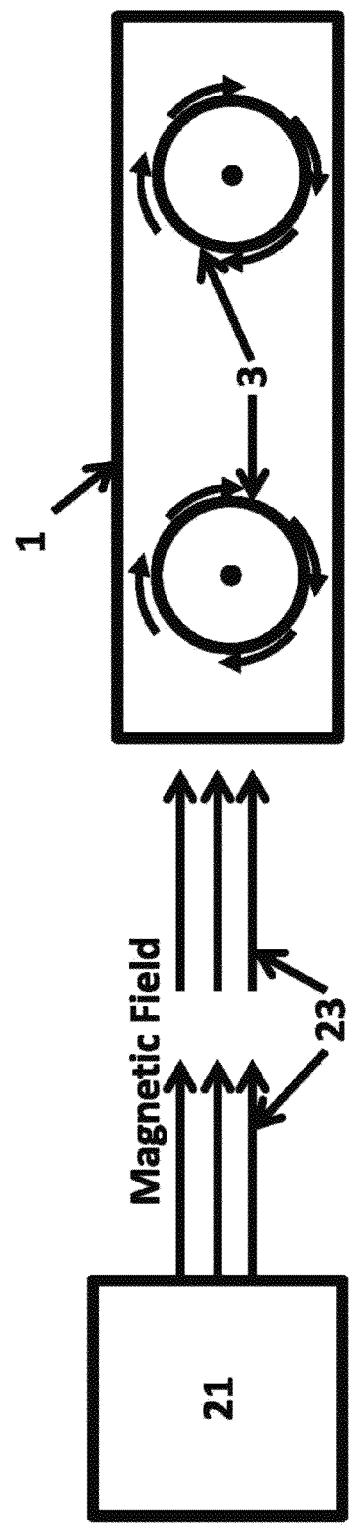
FIG. 2 is a cross-sectional view of one embodiment of a magnetic structure subjected to an alternating magnetic field.

FIG. 2 is a cross-sectional view alone embodiment of a magnetic structure subjected to an alternating magnetic field. As shown, a magnetic field source 21 generates a magnetic field 23 in-plane to the magnetic elements 3 of the magnetic structure 1. The magnetic field source 21 is any method of generating a magnetic field capable of exceeding the active resonance frequency and amplitude curve of the current state. Although FIG. 2 depicts only two magnetic elements 3, any number of magnetic elements 3 in any configuration may be used.

Preferably, the magnetic field source 21 is an electromagnet which produces a magnetic field in-plane to the magnetic structure 1.

FIG. 3

FIG. 3 is a cross-sectional view of one embodiment of a magnetic structure subjected to an alternating magnetic field generated by an electrical conductor, preferably a coil positioned around the magnetic structure 1. Although, FIG. 3 depicts a coil, any electrical coil electromagnetically connected to the magnetic structure may be deployed. In this embodiment, the magnetic field source 21 is an electromagnetic control system 31 electrically connected to an electrical conductor 33. Although FIG. 3 depicts only two magnetic elements 3, any number of magnetic elements 3 in any configuration may be used. In the embodiment shown in FIG. 3, the electrical conductor 33 is connected to the electromagnetic control system 31 using a first wire 9 and a second wire 11, although any means of connecting may be used or the electrical conductor 33 may be directly connected to the electromagnetic control system 31. The electrical conductor 33 is positioned around the magnetic structure 1 whereby the electrical conductor 33 generates a magnetic field that in-plane to the magnetic elements 3 of the magnetic structure 1. In this embodiment, the electromagnetic control system 31 provides an electrical current to the electrical conductor 33. The electromagnetic control system 31 is preferably a computer, microcontroller, ASIC (application integrated circuit) or a combination thereof configured to provide one or more electrical pulses resulting in the control of the magnetic states of the magnetic structure 1 as described herein. Preferably, the electromagnetic control 31 includes a relay, power relay, power transformer, or other means of providing a significant amount of power to the electrical conductor 33 while allowing for a low power control system.

FIG. 4

Figure 4:
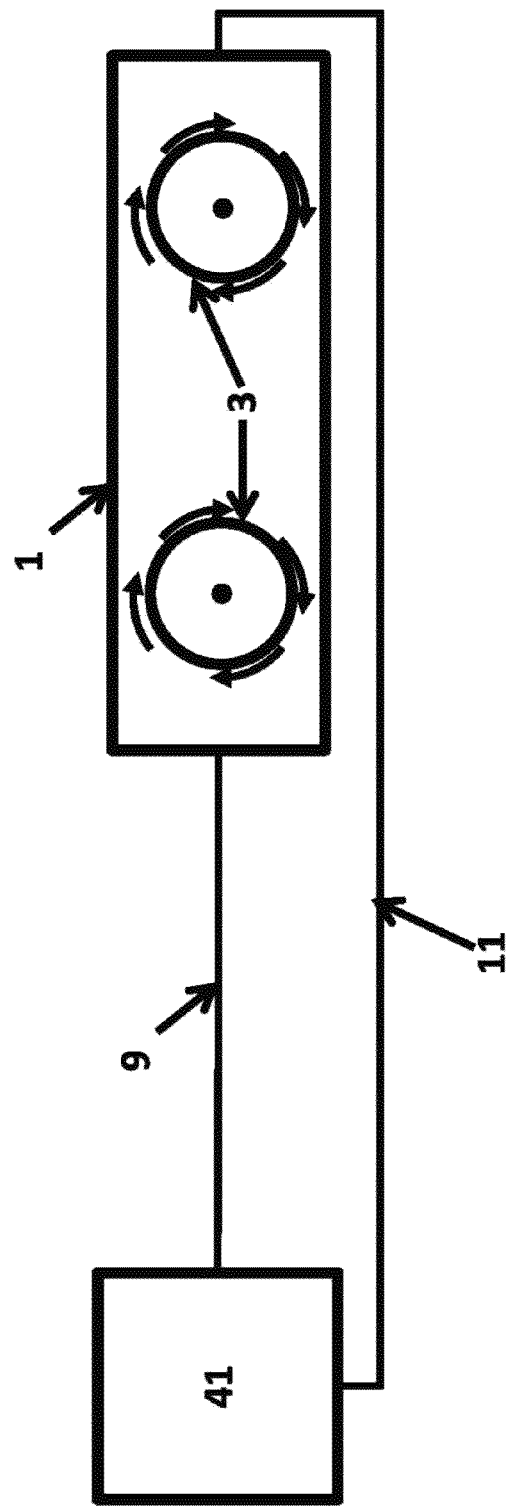
FIG. 4 is a cross-sectional view of one embodiment of a magnetic structure subjected to an alternating electrical current.

FIG. 4 is a cross-sectional view of one embodiment of a magnetic structure 1 subjected to an alternating electrical current. As shown, a current control system 41 is connected to the magnetic structure 1. Although FIG. 4 depicts only two magnetic elements 3, any number of magnetic elements 3 in any configuration may be used. In the embodiment shown in FIG. 4, the magnetic structure 1 is connected to the current control system 41 using a first wire 9 and a second wire 11, although any means of connecting may be used or the magnetic structure 1 may be directly connected to the current control system 41. In this embodiment, the current control system 41 generates an electrical current which passes through the magnetic elements 3 of the magnetic structure 1. The current control system 41 is preferably a computer microcontroller, ASIC (application integrated circuit) or a combination thereof configured to provide one or more electrical pulses resulting in the control of the magnetic states of the magnetic structure 1 as described herein. Preferably, the current control 41 includes a relay, power relay, power transformer, or other means of providing a significant amount of current to the magnetic structure 1, while allowing for a low power control system.

FIG. 5a-c

FIG. 5a depicts one embodiment of a plurality of magnetic field elements 3 on a magnetic structure 1. In this embodiment, the magnetic structure 1 is a substrate and each magnetic element 3 is a coating of ferromagnetic material. In one embodiment, each coating forms two circles with about 1 um diameters and connected by a 740 nm length of conjoined ferromagnetic material of the two circles as shown.

FIG. 5b depicts one embodiment of a magnetic structure 1 with multiple magnetic elements 3 as described above in FIG. 5a, FIG. 5b also depicts the magnetic field lines from magnetic elements 3, which circle around the magnetic structure 1.

FIG. 5c depicts the active resonance frequency and amplitude curve of one embodiment as described in FIG. 5a and FIG. 5b. As shown, when the first magnetic element 51 is in the "down-state" and the second magnetic element 53 is in the "up-state" the magnetic elements of the magnetic structure have the active resonance frequency and amplitude curve 66, with a peak active frequency at about 650 Mhz. When the first magnetic element 57 is in the "up-state" and the second magnetic element 69 is in the "up-state" the magnetic elements of the magnetic structure have the second active resonance frequency and amplitude curve 61, with a peak active resonance at about 305 Mhz. As the active resonance frequency and amplitude curve is the inverse of the absorption spectra, it may be easily determined by one skilled in the art after spectrograph.

FIG. 6a

FIG. 6a depicts a cross-sectional view from the top of one embodiment of a magnetic structure having three magnetic elements. As shown in FIG. 6a, a first magnetic elements 61, a second magnetic element 63 and a third magnetic element 65 form a magnetic structure 1. In FIG. 6a the structure is not shown for simplicity 1.

FIG. 6b depicts the active resonance frequency and amplitude curve of one embodiment as described in FIG. 6a. As shown in FIG. 6b, when the first magnetic element 61 is in the "up-state", the second magnetic element 63 is in the "up-state", and the third magnetic element 65 is in the "up-state", the magnetic elements of the magnetic structure have the first active resonance frequency and amplitude curve 67, with a peak active frequency at about 350 Mhz. When the first magnetic element 61 is in the "up-state", the second magnetic element 63 is in the "down-state", and the third magnetic element 66 is in the "up-state", the magnetic elements of the magnetic structure have the second active resonance frequency and amplitude curve 69, with a peak active frequency at about 400 Mhz and a second peak at around 440 Mhz. When the first magnetic element 61 is in the "up-state", the second magnetic element 63 is in the "up-state", and the third magnetic element 65 is in the "down-state", the magnetic elements of the magnetic structure have the third active resonance frequency and amplitude curve 71, with a peak active frequency at about 450 Mhz. As the active resonance frequency and amplitude curve is the inverse of the absorption spectra, it may be easily determined by one skilled in the art after spectrograph.

Further detail of various embodiments as described herein is described in the following publications, each hereby fully incorporated by reference:

1. S. Jain, V. Novosad, Y. Fradin, J. E. Pearson, and S. D. Bader, "Reconfigurable ground states in connected double-dot system", Appl. Phys. Lett., 102, 052401 (2013), hereby fully incorporated by reference;
2. S. Jain, V. Novosad F. Y. Fradin, J. E. Pearson, V. Tiberkevich, A. N. Slavin and S. D. Bader, "Control and manipulation of the dynamic response of interacting spin vortices", (invited), IEEE Trans. Mag., accepted (2013); and,
3. S. Jain, V. Novosad, Y. Fradin, J. E. Pearson, V. Tiberkevich, A. N. Slavin and S. D. Bader, "From chaos to selective ordering of vortex cores in interacting mesomagnets", Nature Comm., DOI: 10.1038/ncomms2331.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

The invention claimed is:

1. A method for the control of the magnetic states of interacting magnetic elements comprising:
    a) providing a magnetic structure with a plurality of interacting magnetic elements; whereby said magnetic structure comprises a plurality of magnetic states based on the state of each said interacting magnetic element of the magnetic structure;
    b) determining the desired magnetic state of said magnetic structure;
    c) determining the active resonance frequency and amplitude curve of said desired magnetic state; and
    d) subjecting each said magnetic element of said magnetic structure to an alternating, in-plane magnetic field or an alternating electrical current having a frequency and amplitude below said active resonance frequency and amplitude curve of said desired magnetic state and above the active resonance frequency and amplitude curve of the current state of said magnetic structure until the magnetic state of said magnetic structure is at the desired magnetic state.

2. The method for the control of spin states of interacting magnetic elements of claim 1 whereby said step of subjecting each said magnetic element of said magnetic structure to an alternating magnetic field or electrical current comprises:
    a) subjecting each said magnetic element to a magnetic field in-plane to said magnetic structure.

3. The method for the control of spin states of interacting magnetic elements of claim 1 whereby said step of subjecting each said magnetic element of said magnetic structure to an alternating magnetic field or electrical current comprises:
 a) subjecting each said magnetic element to an electrical current passing through each said magnetic element of said magnetic structure.

4. The method for the control of spin states of interacting magnetic elements of claim 1 further comprising:
 a) constructing a resistance table comprising the electrical resistance of each magnetic state of said magnetic structure and the corresponding active resonance frequency and amplitude curve; and whereby
 b) said step of determining the active resonance frequency and amplitude curve of said desired magnetic state comprises determining the electrical resistance of said magnetic structure and looking-up the corresponding active resonance frequency and amplitude curve in said constructed resistance table.

5. The method for the control of spin states of interacting magnetic elements of claim 1 whereby:
 a) said magnetic structure has a 3D shape.

6. The method for the control of spin states of interacting magnetic elements of claim 1 whereby:
 a) said magnetic structure has a 2D shape.

7. The method for the control of spin states of interacting magnetic elements of claim 1 whereby:
 a) each said magnetic element is in a single vortex magnetic state.

8. The method for the control of spin states of interacting magnetic elements of claim 7 whereby
 a) each said magnetic element comprises $Ni_{80}Fe_{20}$; and
 b) each said magnetic element comprises a circular shape having a thickness between 8-150 nm and a diameter between 100-2,500 nm.

9. The method for the control of spin states of interacting magnetic elements of claim 1 whereby:
 a) each said magnetic element is in a single domain magnetic state.

10. The method for the control of spin states of interacting magnetic elements of claim 1 whereby:
 a) each said magnetic element comprises Ni and Fe.

11. The method for the control of spin states of interacting magnetic elements of claim 1 whereby
 a) said magnetic structure comprises two interacting magnetic elements.

12. The method for the control of spin states of interacting magnetic elements of claim 1 whereby
 a) said magnetic structure comprises three interacting magnetic elements.

13. The method for the control of spin states of interacting magnetic elements of claim 1 whereby:
 a) said desired magnetic state said magnetic structure represents one or more bits of data, thereby storing a data in said magnetic structure; and further comprising
 b) a step for determining the value of each magnetic state of said magnetic element, thereby reading said stored data.

14. The method for the control of spin states of interacting magnetic elements of claim 1 whereby:
 a) said desired magnetic state of said magnetic structure is each said magnetic element positioned in the same direction; and further comprising
 b) a step for applying a magnetic field or electrical current in order to obtain a uniform magnetic state in said magnetic structure, thereby generating a microwave radiation.

15. The method for the control of spin states of interacting magnetic elements of claim 14 whereby:
 a) said magnetic structure is a magnonic crystal.

16. The method for the control of spin states of interacting magnetic elements of claim 15 whereby:
 a) said magnetic structure has a 3D shape; and
 b) each said magnetic element is in a single vortex magnetic state.

17. The method for the control of spin states of interacting magnetic elements of claim 7 whereby:
 a) said magnetic structure has a 2D shape; and
 b) each said magnetic element comprises Ni and Fe.

18. The method for the control of spin states of interacting magnetic elements of claim 17 further comprising:
 a) constructing a resistance table comprising the electrical resistance of each magnetic state of said magnetic structure and the corresponding active resonance frequency and amplitude curve; and whereby
 b) said step of determining the active resonance frequency and amplitude curve of said desired magnetic state comprises determining the electrical resistance of said magnetic structure and looking-up the corresponding active resonance frequency and amplitude curve in said constructed resistance table; and
 c) said step of subjecting each said magnetic element of said magnetic structure to an alternating magnetic field or electrical current comprises subjecting each said magnetic element to an electrical current passing through each said magnetic element of said magnetic structure.

19. The method for the control of spin states of interacting magnetic elements of claim 18 whereby
 a) said magnetic structure comprises two interacting magnetic elements.

20. The method for the control of spin states of interacting magnetic elements of claim 18 whereby
 a) said magnetic structure comprises three interacting magnetic elements.

* * * * *